(12) United States Patent
Chow et al.

(10) Patent No.: US 6,656,774 B1
(45) Date of Patent: Dec. 2, 2003

(54) METHOD TO ENHANCE OPERATING CHARACTERISTICS OF FET, IGBT, AND MCT STRUCTURES

(75) Inventors: Tat-Sing Paul Chow, Schenectady, NY (US); Victor Albert Keith Temple, Clifton Park, NY (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 08/310,041

(22) Filed: Sep. 22, 1994

Related U.S. Application Data

(62) Division of application No. 08/005,857, filed on Jan. 15, 1993, now abandoned, which is a continuation of application No. 07/631,214, filed on Dec. 21, 1990, now abandoned, which is a continuation of application No. 07/375,177, filed on Jul. 3, 1989, now abandoned.

(51) Int. Cl.[7] .............................................. H01L 21/332
(52) U.S. Cl. ...................... 438/133; 438/137; 438/138; 438/514; 438/519; 438/520
(58) Field of Search ................... 357/23.4, 90; 438/133, 438/137, 138, 514, 519, 520

(56) References Cited

U.S. PATENT DOCUMENTS

| | | | |
|---|---|---|---|
| 4,242,691 A | | 12/1980 | Kotani et al. .................. 357/23 |
| 4,364,073 A | * | 12/1982 | Becke et al. ................. 357/23.4 |
| 4,656,492 A | | 4/1987 | Sunami et al. ............... 357/23.3 |
| 4,684,413 A | * | 8/1987 | Goodman et al. ......... 357/23.4 |
| 4,689,647 A | * | 8/1987 | Nakagawa et al. ......... 357/23.4 |
| 4,746,964 A | * | 5/1988 | Aronowitz .................... 357/90 |
| 4,775,879 A | * | 10/1988 | Robb et al. ................. 357/23.4 |
| 4,779,123 A | * | 10/1988 | Becuya et al. ............. 357/23.4 |
| 4,811,065 A | * | 3/1989 | Cogan ........................ 357/23.4 |
| 4,823,172 A | * | 4/1989 | Mihara ....................... 357/23.4 |

FOREIGN PATENT DOCUMENTS

| | | | | |
|---|---|---|---|---|
| GB | 2062349 | * | 10/1980 | ................. 357/23.4 |
| JP | 52042164 | * | 3/1982 | ................. 357/23.4 |
| JP | 59149057 | * | 8/1984 | ................. 357/23.4 |
| JP | 60186068 | * | 9/1985 | ................. 357/23.4 |
| JP | 63133677 | * | 6/1988 | ................. 357/23.4 |

OTHER PUBLICATIONS

Ghandi, Sorab K., "The Theory and Practice of Microelectronics", John Wiley & Sons, p. 91.

Antonaidis, D.A. et al., "Diffusion of Indium in Silicon Insert and Oxidizing Ambients", Journal of Applied Physics, 53 (12), Dec. 1982, pp. 9214–9216.

Chow, T.P. et al., "Counterdoping of MOS Channel (CDC)–A New Technique of Improving Suppression of Latching in Insulated Gate Bipolar Transistors", *IEEE Electron Device Letters*, vol. 9, No. 1., Jan. 1988, pp. 29–31.

\* cited by examiner

Primary Examiner—Long Pham
(74) Attorney, Agent, or Firm—Duane Morris LLP

(57) ABSTRACT

Doping of the P type base region in a MOSFET or an IGBT with a combination of boron and one or more of indium, aluminum and gallium, provides a structure having a lower P type doping level in the channel portion of the structure than in the remainder of the structure without requiring counter doping of the channel. The doping level of the emitter region of an MCT is kept high everywhere except in the channel in order to provide a fast turn-off time for the MCT.

4 Claims, 12 Drawing Sheets

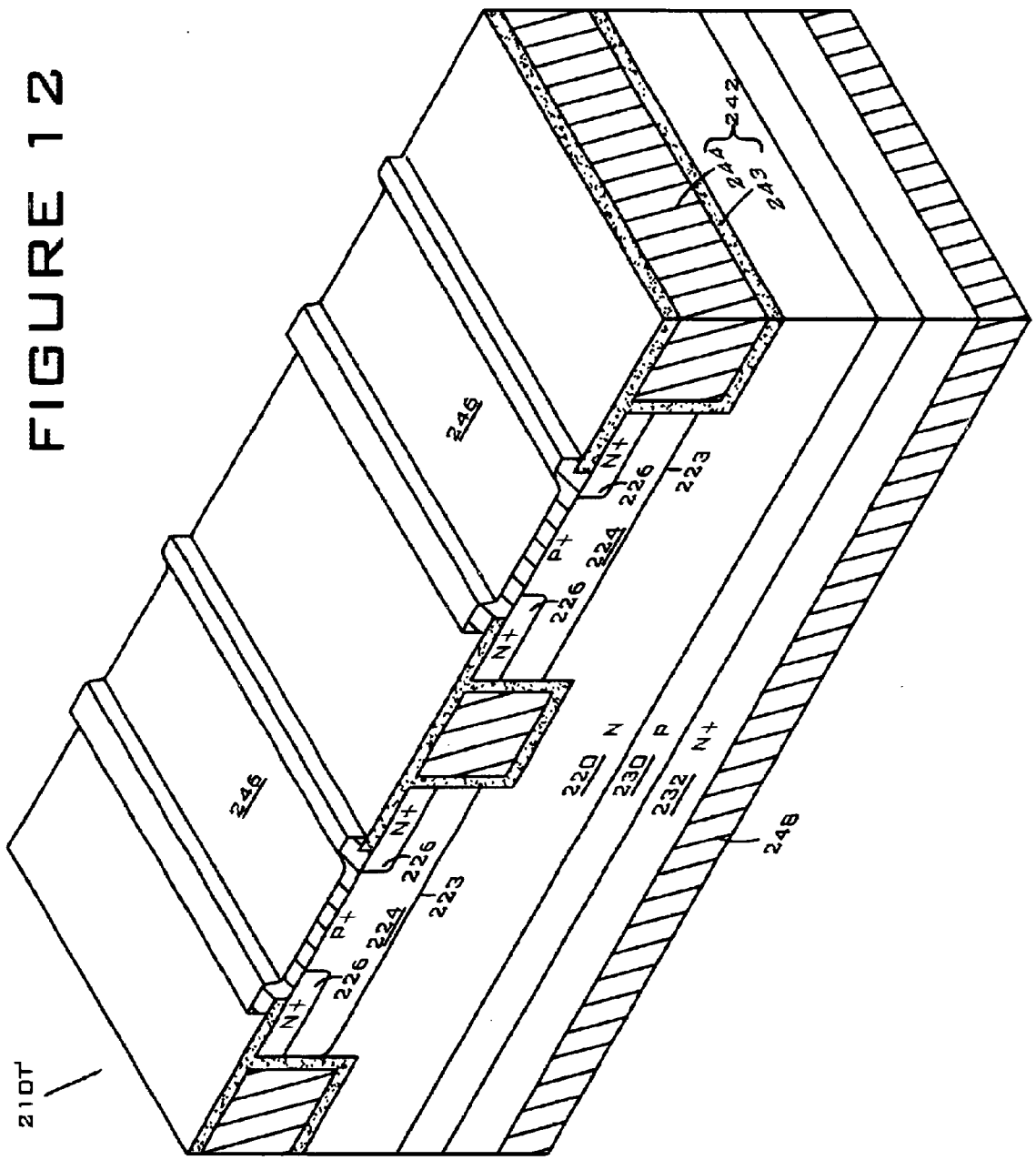

METHOD TO ENHANCE OPERATING CHARACTERISTICS OF FET, IGBT, AND MCT STRUCTURES

This is a division of application Ser. No. 08/005,857, filed Jan. 15, 1993 now abandoned. This application is a continuation of Ser. No. 07/631,214 Dec. 21, 1990 ABN which is a continuation of Ser. No. 07/375,177 Jul 3, 1989 ABN.

BACKGROUND OF THE INVENTION

1. Field of the Invention

The present invention relates to semiconductor devices, and more particularly, to improvement of the operating characteristics of FETs, IGBTs and MCTs.

2. Background of the Invention

In an FET in which an N+ source region is spaced from an N type drift/drain region by a P type body region with an insulated gate electrode disposed over the P type body region and extending from the source region to the drift/drain region, a parasitic NPN bipolar transistor is disposed in parallel with the desired field effect transistor. A first main electrode is disposed in ohmic contact with the source and body regions and a second main electrode is disposed in ohmic contact with the drain region. In this parasitic bipolar transistor, the N type source region functions as an emitter, the P type body region functions as the base region and the N type drain region functions as the collector and the emitter/base function is shorted. During FET turn-off of an inductive load, this parasitic NPN transistor can become conductive and have a detrimental effect on the operation of the field effect transistor or result in its destruction. In circuits in which the body/drift region PN junction (an inherent diode) becomes forward biased, there is a substantial hole current in the P type body region extension beneath the source region. This current, in combination with the relative high resistance of that portion of the body region, can produce a sufficient voltage drop to forward bias the source/body junction far from the first main electrode contact which shorts that junction. When that portion of the source/body PN junction injects carriers, the NPN parasitic transistor becomes conductive, which can destroy the device. In power FETs, a large gain in this parasitic NPN transistor has an adverse effect on the ruggedness of the FET because the larger the gain of this NPN transistor, the smaller the current required to turn it on and the smaller the safe operating area of the FET is. The safe operating area is the combination of current and voltage which the FET can withstand during the process of turning off without destruction of the device. At a given voltage, increasing the current through the FET to more than the maximum SOA value for that voltage leads to breakdown of the device. Similarly, increasing the voltage at a fixed current level to more than the SOA maximum voltage for that current also leads to breakdown of the device which prevents the device from turning off. Such breakdown can also result in destruction of the device. For these reasons, it is considered desirable to minimize the gain of the parasitic NPN transistor in power FETs. The gain of this NPN transistor depends on the doping level of the P type body region. The higher the doping level of the P type body region, the lower is the gain of this NPN transistor. Consequently, in order to minimize the adverse effect of this parasitic NPN transistor, it is desirable to dope the body region as heavily P type as possible. Unfortunately, heavy doping of the body region has an adverse effect on the operation of the desired field effect transistor. That is, increasing the doping level of the P type body region increases the threshold voltage of the N type channel extending through the P type body region from the source to drain region, i.e. the gate voltage necessary to render that channel conductive to electrons.

It is known in the prior art to heavily dope the P type body region and to counter dope just the channel portion of the body region by implanting N type dopant material into the surface of the body region to reduce its net P type doping level to adjust the threshold voltage of the field effect transistor independent of the doping level of the P type body region.

The presence of this parasitic NPN bipolar transistor does not have any significant effect on the ON-state operation of the field effect transistor. It is only during turn-off of the field effect transistor in the presence of an inductive load or during turn-off of the inherent diode that this parasitic NPN bipolar transistor has an effect on the operating characteristics of the device. Thus, this parasitic bipolar transistor only affects the operating characteristics of a field effect transistor if that field effect transistor is a power device which will be operated near the limits of its safe operating area.

An insulated gate bipolar transistor (IGBT) is similar in structure to an FET, except that a P+ collector region is disposed between the N type drift region and second main electrode. Consequently, an IGBT contains a similar parasitic NPN bipolar transistor. However, this parasitic NPN transistor does not affect the SOA of the device because it is the lower or PNP transistor which limits device SOA. Rather, in the IGBT, this parasitic transistor affects the main current level at which the IGBT latches in the ON-state. The larger the gain of this parasitic NPN transistor, the lower the latching current of the IGBT becomes. As is well known, the IGBT is intended to be a non-latching device and, therefore, such decreased latching current is undesirable. Consequently, it is desirable to minimize the gain of the parasitic NPN transistor in an IGBT in order to maximize the latching current of the IGBT. The same techniques may be used to minimize the gain of the parasitic NPN transistor in an IGBT as are used in FETs. Thus, the only reason for reducing the gain of the parasitic NPN transistor in an IGBT is to increase latching current.

An MOS controlled thyristor (MCT) incorporates a field effect structure designed to carry current from the N type base region directly to the first power electrode to bypass the P type emitter/N type base region junction of the thyristor and thereby interrupt the regenerative action in the thyristor to turn it off. Introduction of this field effect structure creates what is in effect a field effect transistor of the N+ source region of the turn-off structure, the P type emitter region of the thyristor and the N type base region of the thyristor. This structure includes a parasitic NPN bipolar transistor. By analogy to the IGBT, decreasing the gain of that parasitic NPN bipolar transistor is expected to increase the latching current of the MCT, which is undesirable since the MCT is intended to latch on in the ON-state. Consequently, the prior art provides no reason to attempt to reduce the gain of this parasitic NPN bipolar transistor.

Consequently, the prior art provides no teaching or suggestion for heavily doping the portion of the P type emitter region of an MCT in the vicinity of the turn-off channel of the MOS structure in combination with counter doping of that channel. The prior art incentives for such structures in FETs or IGBTs are not applicable to MCTs because the problems that structure ameliorates in FETs and IGBT do not exist in the MCTs.

It has become desirable to operate circuits including MCTs at as high a frequency as possible, in such systems as dc-to-dc power converters. Consequently, new MCT structures which facilitate operation at higher frequencies are desirable.

With the advent of trench gate FETs and IGBTs, control of the gain of the parasitic NPN bipolar transistor has been one of the considerations in the trade-off decision as to whether to use a trench structure or a planar structure because ion implantation counter doping of the channel portion of the body or base region of a trench gate device is not possible because the trench walls are normally perpendicular to the major surface of the wafer whereby ion implantation ions are traveling parallel to the trench walls and thus do not implant in the body or base region. Since counter doping is not possible, a designer, in designing a trench gate FET or IGBT, must choose between a high threshold voltage with a low gain parasitic NPN transistor and a low threshold voltage with a high gain parasitic NPN transistor. Consequently, an improved structure for minimizing the gain of the parasitic NPN transistor in FETs and IGBTs, especially trench gate versions is needed, as is a method of providing such a structure.

While it is known that indium and aluminum are P type dopants, it is standard practice in the semiconductor industry to avoid using indium and aluminum as dopants in silicon because their small segregation coefficients lead to unpredictability of a process to obtain a desired structure. Use of boron as a P type dopant produces device structures and characteristics which are quite predictable. The reasons behind the essentially exclusive use of boron as a P type dopant are discussed in "The Theory and Practice of Microelectronics" by Sorab K. Ghandi published by John Wiley & Sons, especially in the "Choice of p-type Impurity" section. While there is much literature on the characteristics of boron and phosphorous as dopants in silicon, there is much less literature dealing with the use of indium and aluminum to create P type doped regions. An article entitled "Diffusion of Indium in Silicon Inert and Oxidizing Ambients", by D.A. Antoniadis et al., which appeared in the Journal of Applied Physics, Volume 53, No. 12, December 1982, pages 9214–9216 presents data on the diffusion characteristics of indium and concludes that indium has a segregation coefficient of 0.1. Both of these references are incorporated herein by reference.

Those skilled in the semiconductor art rely on established, controllable processes for the fabrication of devices because of their established, relatively high yields, rather than experimenting with processes which are known to be difficult to predict or control, unless there is a clear incentive for the use of the "unpredictable" process. There has been no such incentive for the use of indium or aluminum as dopants in silicon in the fabrication of field effect devices because of the availability and established techniques for controlling ion implantation of the counter dopant material in the channel portion of the body region to control the threshold voltage of the insulated gate structure in the presence of heavy body region dopant concentrations.

OBJECTS OF THE INVENTION

Accordingly, a primary object of the present invention is to provide an improved structure for controlling the threshold voltage of FETs and IGBTs having trench gates.

Another object of the present invention is to provide an MCT structure having a faster turn-off than prior art MCT structures.

Another object is to provide an improved method of fabricating FETs, IGBTs and MCTs.

SUMMARY OF THE INVENTION

In accordance with the above objects and others which will become apparent from the specification as a whole, including the drawings, an FET is provided with a heavily doped P type body region and a more lightly doped channel region by doping the body region with one or more of indium, aluminum and gallium or a combination of dopants including boron and one or more of indium, aluminum and gallium. Indium and aluminum are depleted in the body region adjacent the gate oxide because indium and aluminum both have small silicon/silicon dioxide segregation coefficients. The concentration of gallium is substantially reduced because of its higher diffusion rate in the oxide. The resulting structure is functionally equivalent to counter doping of the channel where only boron has been used to dope the base region. However, unlike counter doping, this technique is equally effective for trench gate structures and planar structures. Consequently, it is a substantial advance over the use of ion implantation counter doping since it provides independent control over body doping level and threshold voltage in trench gate devices.

Use of a combination of boron and one or more of aluminum, indium and gallium as the base dopant in an IGBT is similar in providing the same benefits provided by counter doping the channel portion of the base region.

We have found that in an MCT, providing a heavily doped P type emitter region along with a low threshold voltage channel in the MOS turn-off structure in that emitter region provides a substantial improvement in the MCT's operating characteristics, in particular, by providing a much more rapid turn-off of the device upon application of a turn-off voltage to the insulated gate. This newly desirable structure may be provided either by doping the P type emitter region with a combination of boron and one or more of indium, aluminum and gallium or by counter doping the channel portion of that P type emitter region of a surface gate device to provide a low threshold voltage along with a heavy doping of the emitter region everywhere except in the channel itself.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 12 illustrates a trench gate MCT structure in accordance with the present invention.

DETAILED DESCRIPTION

Figure 1:
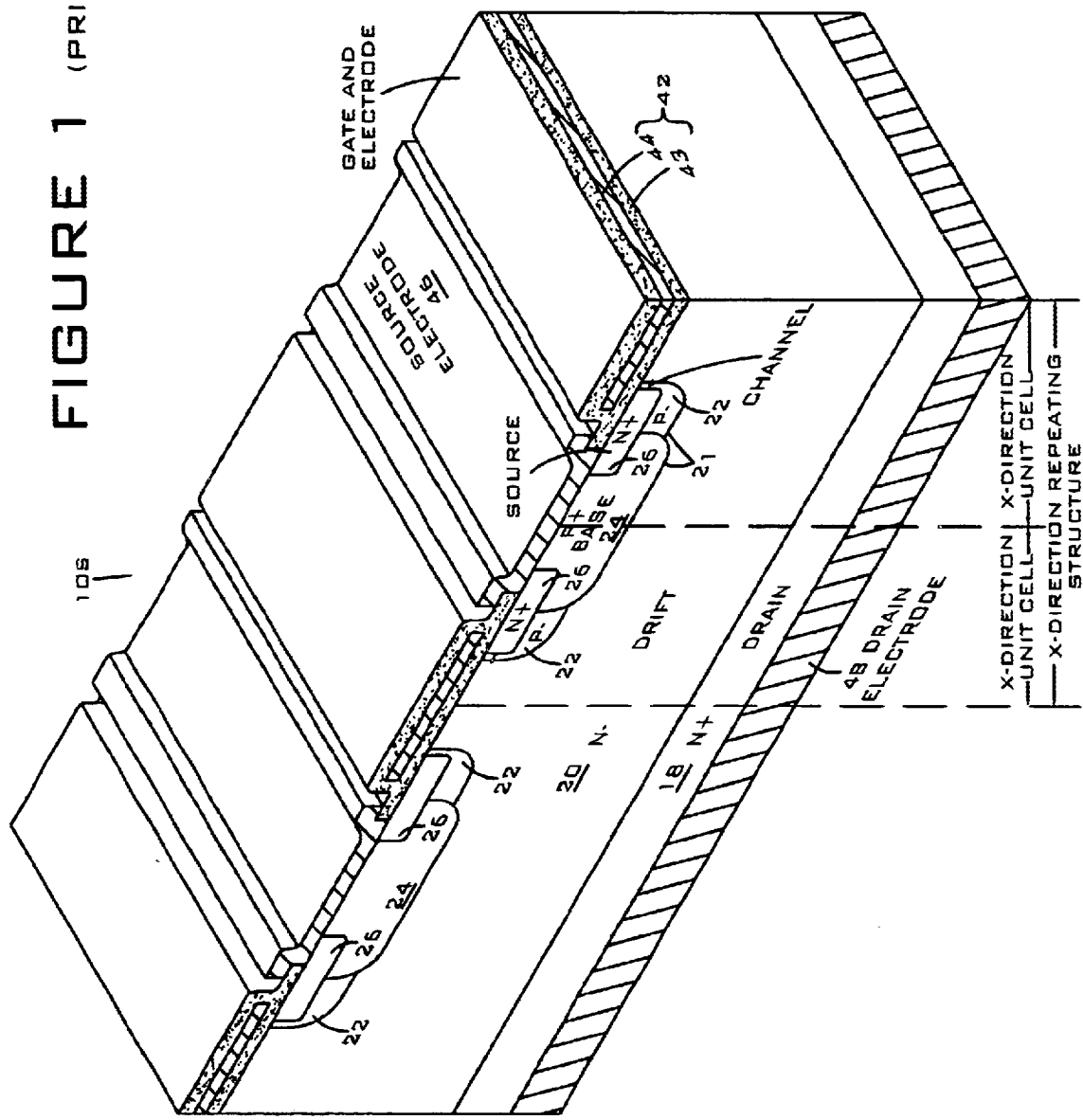
FIG. 1 illustrates a prior art surface gate, vertical FET structure.

In FIG. 1, a prior art vertical surface gate power field effect transistor is illustrated generally at 10S in a perspective cross-section view. In this specification, the adjective "vertical" when used to modify a device, as in a "vertical FET", refers to the fact that in the device structure, the current flows through the chip between what were the top and bottom surfaces of the wafer, as opposed to flowing laterally or substantially parallel to the wafer's major surfaces. This device comprises a body of semiconductor material having a heavily doped N type (N+) drain region 18 adjacent its lower major surface, a lightly doped N type (N−) drift region 20 contiguous with the upper surface of the drain region 18 and extending to the upper major surface of the semiconductor body. A heavily doped P type (P+) body region 24 extends into the drift region 20 from the upper surface of the semiconductor body. A lightly doped P type (P−) body region extension 22 extends into the drift region 20 from the upper surface of the semiconductor body and is contiguous with, but extends laterally from the P+ main potion 24 of the body region. A heavily doped N type (N+) source region 26 extends into the P+ main portion 24 of the body region and into the P− body region extension 22 from the upper surface of the semiconductor body. This results in the complex PN junction configuration 21 between the body and drift regions. An insulated gate electrode 42 is disposed on the upper surface of the semiconductor body and extends from in alignment with the source region 26, across the body region extension 22 and into alignment with the drift region 20 to control the conductivity for electrons of a channel portion of the body region extension 22. A first main (source) electrode 46 is disposed on the upper surface of the semiconductor body in ohmic contact with the source region 26 and the main potion 24 of the body region. A second main (drain) electrode 48 is disposed on the lower surface of the semiconductor body in ohmic contact with the drain region 18.

As illustrated in FIG. 1, the device 10S comprises a plurality of unit cells, each of which extends in the Y-direction in the figure(an XYZ coordinate system is in the lower left portion of the figure) with a plurality of unit cells distributed in the X-direction. As indicated in the figure, adjacent X-direction unit cells are mirror images of each other and an X-direction repeating structure comprises two unit cells. If desired, the source region 26 in one of the unit cells of the X-direction repeating structure may be omitted, in which case, the X-direction repeating structure is also a unit cell.

Inherent in the structure 10S is an NPN bipolar transistor having an emitter region 26, a base region 24/22 and a collector region 20/18. This bipolar transistor is often referred to as a parasitic transistor because (1) its presence is not desired, even though it is inherent in the field effect transistor structure, and (2) it is detrimental to the operation of the field effect transistor if it becomes conductive. It is to prevent this parasitic NPN bipolar transistor from becoming conductive that the main portion 24 of the body region is heavily doped P type material, since an N+/P+ junction has a lower emitter injection efficiency than an N+/P junction and, therefore, tends to produce a low gain transistor which is less likely to become conductive than a high gain transistor. The body region extension 22 is lightly doped P type material in order to provide the surface channel with an acceptably low threshold voltage for rendering the channel conductive to electrons. Unfortunately, this low doping level in the body region extension forms a second portion of the parasitic NPN bipolar transistor which has a higher gain than the portion involving the P+ main portion of the body region. It is this second portion of the parasitic transistor which becomes conductive first and thus, it is this portion which limits the turn-off operating characteristics of the field effect transistor. FETs of this type are normally fabricated by first diffusing the body region extension 22 of the body region through a window in the gate oxide followed by diffusion of the P+ main portion 24 of the body region through the same window in the gate oxide. This is followed by blocking of the middle of that window to create two separate windows along the edge of the gate oxide through which source regions 26 are subsequently diffused to create the illustrated structure.

Figure 2:
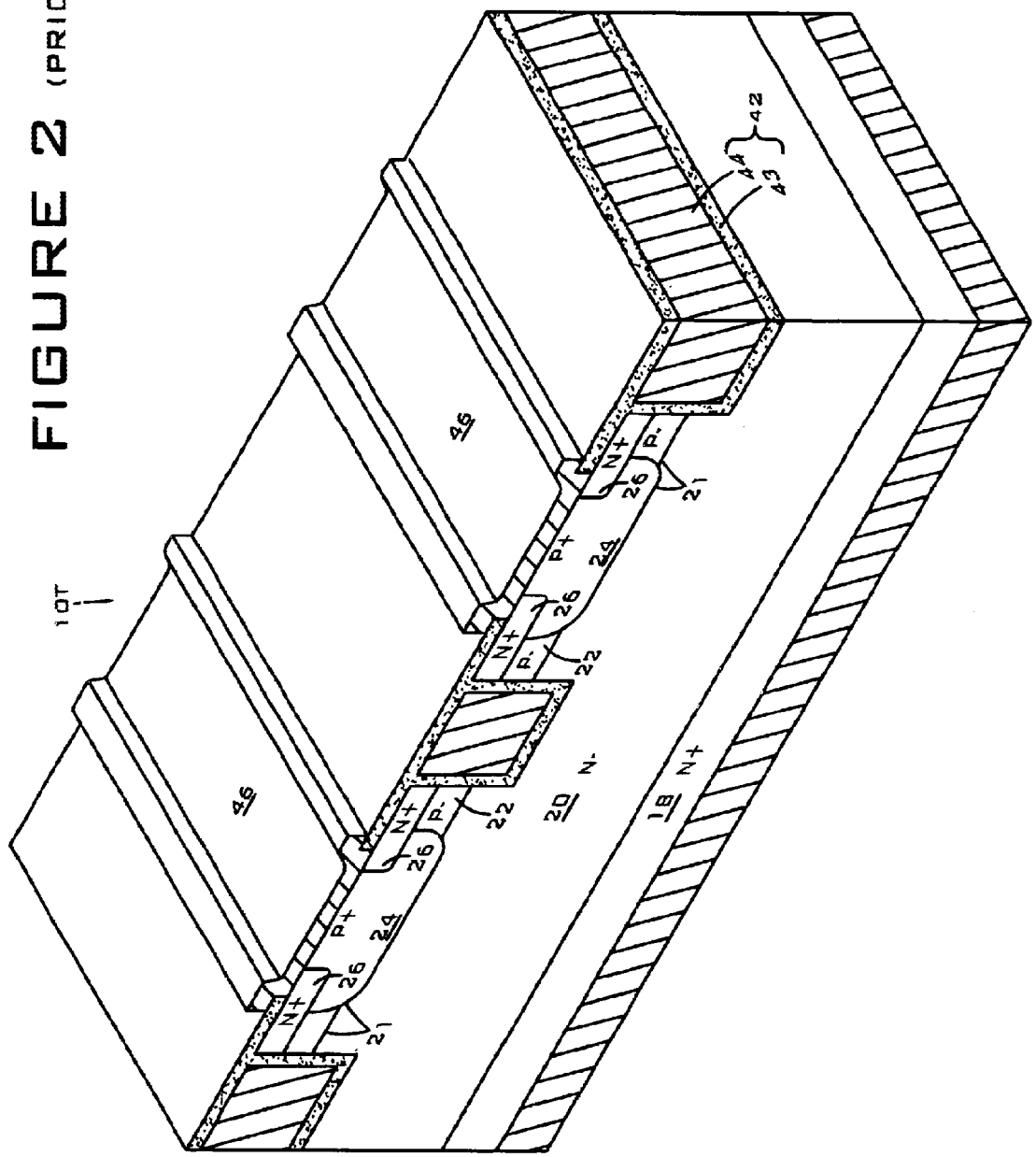
FIG. 2 illustrates a prior art trench gate, vertical FET.

Thereafter, the surface of the body region extension portion 22 is counter doped by ion implantation through the gate oxide 43. While this structure allows the main portion 24 of the body region to be heavily doped P type and the body region extension portion 22 more remote from the surface to be moderately doped, it still leaves the body region extension portion 22 less heavily doped than the P+ main portion 24 and leaves the portion of the parasitic bipolar transistor which includes the body region extension as a relatively high gain bipolar transistor. This is a particular problem in the case of a trench gate structure such as that illustrated in FIG. 2 at 10T in which the body region extension portion 22 of the body region is the same length (vertically) as the base region itself, since for a short channel device, the body region becomes very thin and results in a high gain parasitic NPN transistor comprising the source region 26, the body region extension portion 22 of the body region and the drift/drain region 20/18. This contrasts with the planar gate electrode structure illustrated in FIG. 1 wherein most of the body region portion of the NPN bipolar transistor is substantially thicker than the length of the channel. Further, with the trench gate structure illustrated, it becomes impossible to counter dope the surface of the body region extension 22 to reduce the threshold voltage because of the vertical nature of the trench wall at that location. However, the PN junction 21 still has a complex configuration.

Figure 3:
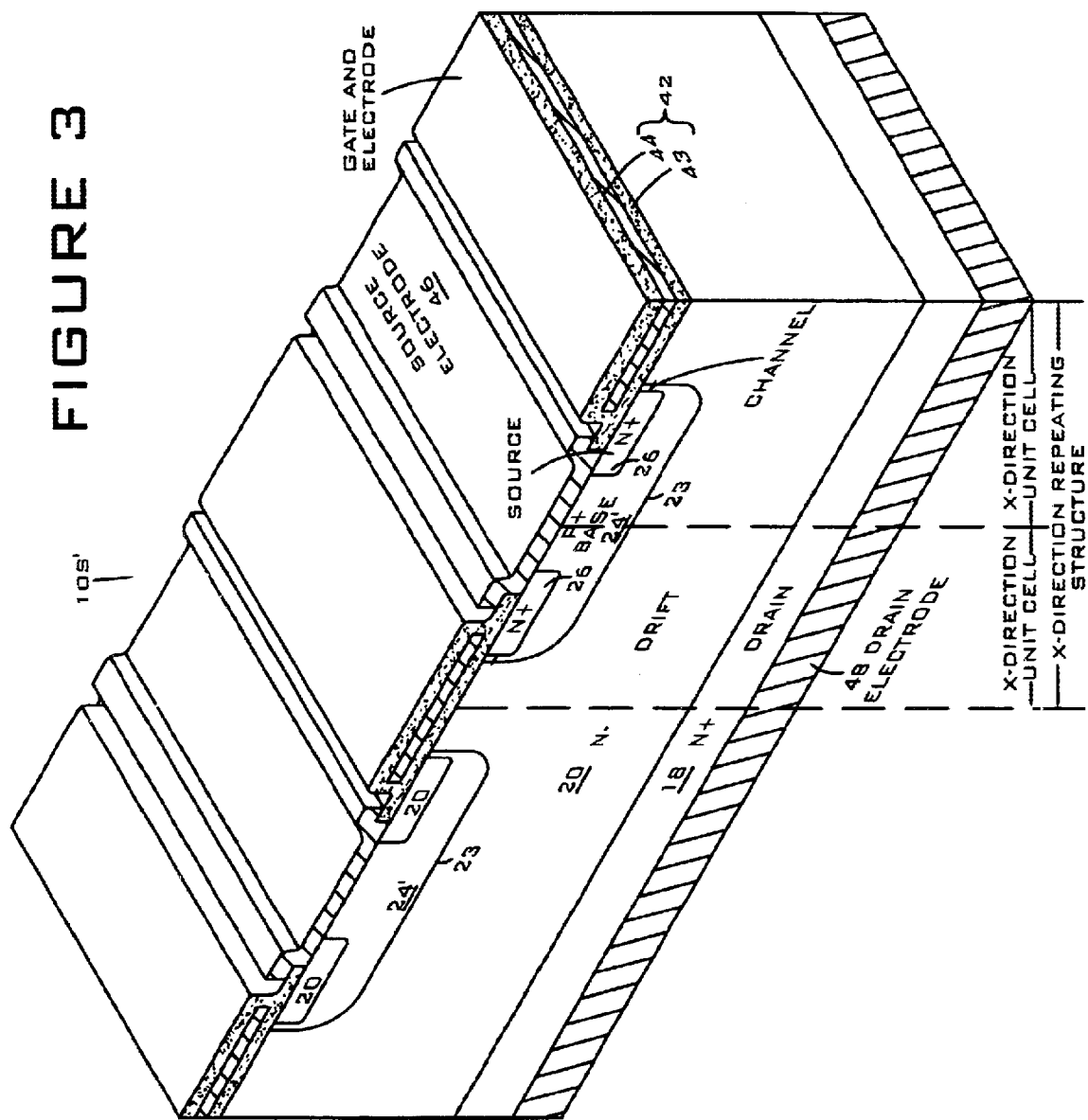
FIG. 3 illustrates a surface gate, vertical FET structure in accordance with the invention.

We have found that the fabrication of FETs can be improved by eliminating the separate doping of the body region extension and forming the P+ portion of the body region 24 by use of one or more of indium, aluminum and gallium or a combination of boron and one or more of indium, aluminum and gallium to provide the structure 10S' shown in FIG. 3 in which the PN junction 23 between the drift region 20 and the body region 24 has a much simpler configuration. This is because of the small silicon/silicon dioxide segregation coefficients for indium and aluminum and the higher diffusion rate of gallium in silicon dioxide. It is noted that the segregation coefficients of P-type dopants may be less than 0.3 and the diffusion rate of a P-type dopant in oxide may be two times faster than the diffusion rate in semiconductor material. Consequently, the pre-diffusion of the body region extension portion of the body region may be dispensed with and the P+ main portion of the body region may be diffused directly, thereby providing a simple PN junction contour 23. However, if one of the dopants diffuses significantly faster than the other in silicon, it is considered desirable to diffuse the slow diffuser first so that the two dopants will diffuse to the same depth. There are some indications that indium alone does not form a good PN junction. Consequently, we prefer to use a combination of boron and indium rather than indium. Use of a combination of boron and indium also has the benefit of assuring the formation of a high quality ohmic contact between the body region and the source electrode.

This doping technique results in the formation of a P type body region which is heavily doped everywhere except adjacent the surface under the gate oxide where the small segregation coefficient of the indium or aluminum essentially totally depletes the surface portion of the silicon of the indium or aluminum dopant, thereby leaving only the boron dopant. The concentration of the boron is selected to provide the desired threshold voltage, while the concentration of the indium or aluminum is selected to provide the desired overall P type doping level in the remainder of the body region. This effectively suppresses the parasitic NPN transistor. This suppression is achieved at the expense of the use of a fabrication process which is relatively unpredictable and which requires trial and error fine tuning to obtain dopant concentration and fabrication sequences which result in a device having the desired doping levels in the appropriate locations. It may also be desirable to provide a more heavily boron doped region at the electrode contact surface.

Figure 4:
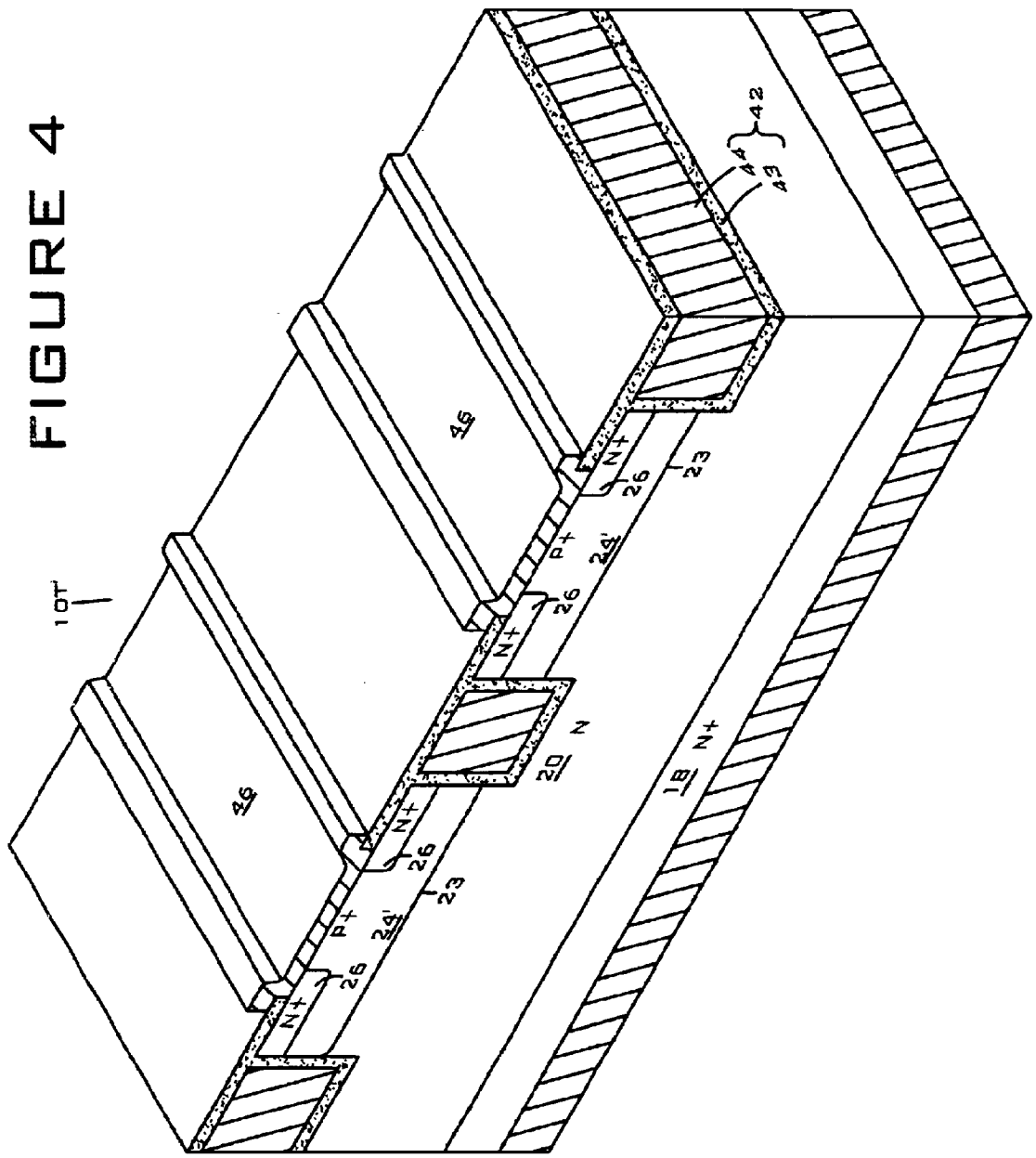
FIG. 4 illustrates a trench gate, vertical FET in accordance with the invention.

In the trench structure 10T' shown in FIG. 4, a further substantial advantage which results from this fabrication process is the fact that the growth of the gate oxide on the sides of the trench inherently depletes the channel portion of the body region of the aluminum, indium or gallium dopant, without any need for ion implantation of counter doping into the vertical trench wall. Further, since the body region itself is formed by diffusion into an existing N type region 20 and the source region 26 is formed by diffusion into the body region 24, the depletion of the indium, aluminum or gallium at the gate oxide surface has the effect of shortening the channel portion of the body region due to an inward contraction into the body region of the local interfaces between the P type body region and the N type drift region and N type source region. The PN junction 23 is otherwise disposed in a single plane. Consequently, in this trench gate structure, the channel portion of the body region is shorter (vertically) than the body region a slightly greater distance from the trench surface. As a consequence, this structure is more effective in suppressing the parasitic NPN bipolar transistor than is the prior art structure.

Figure 5:
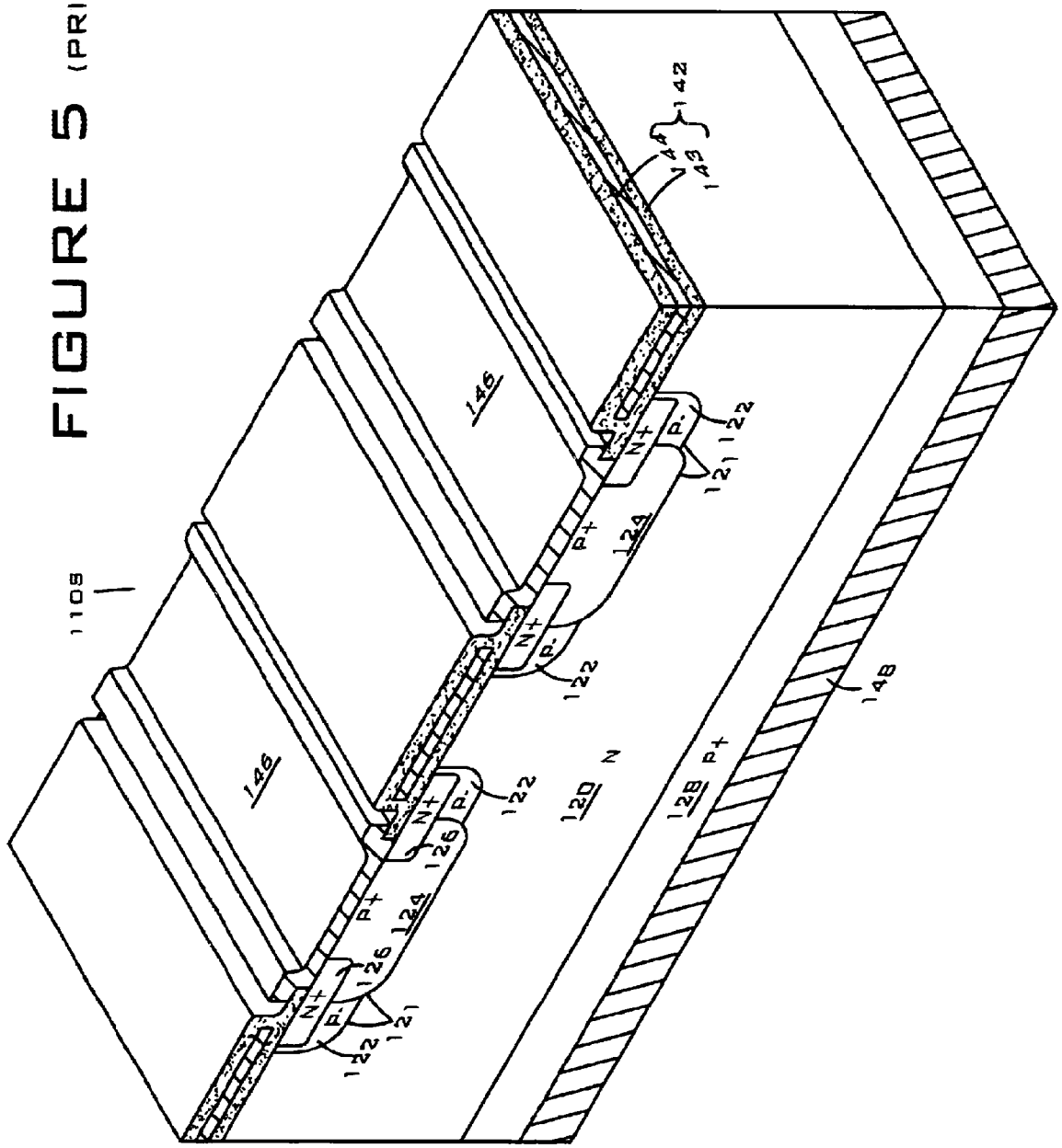
FIG. 5 illustrates a prior art surface gate vertical IGBT structure.
Figure 6:
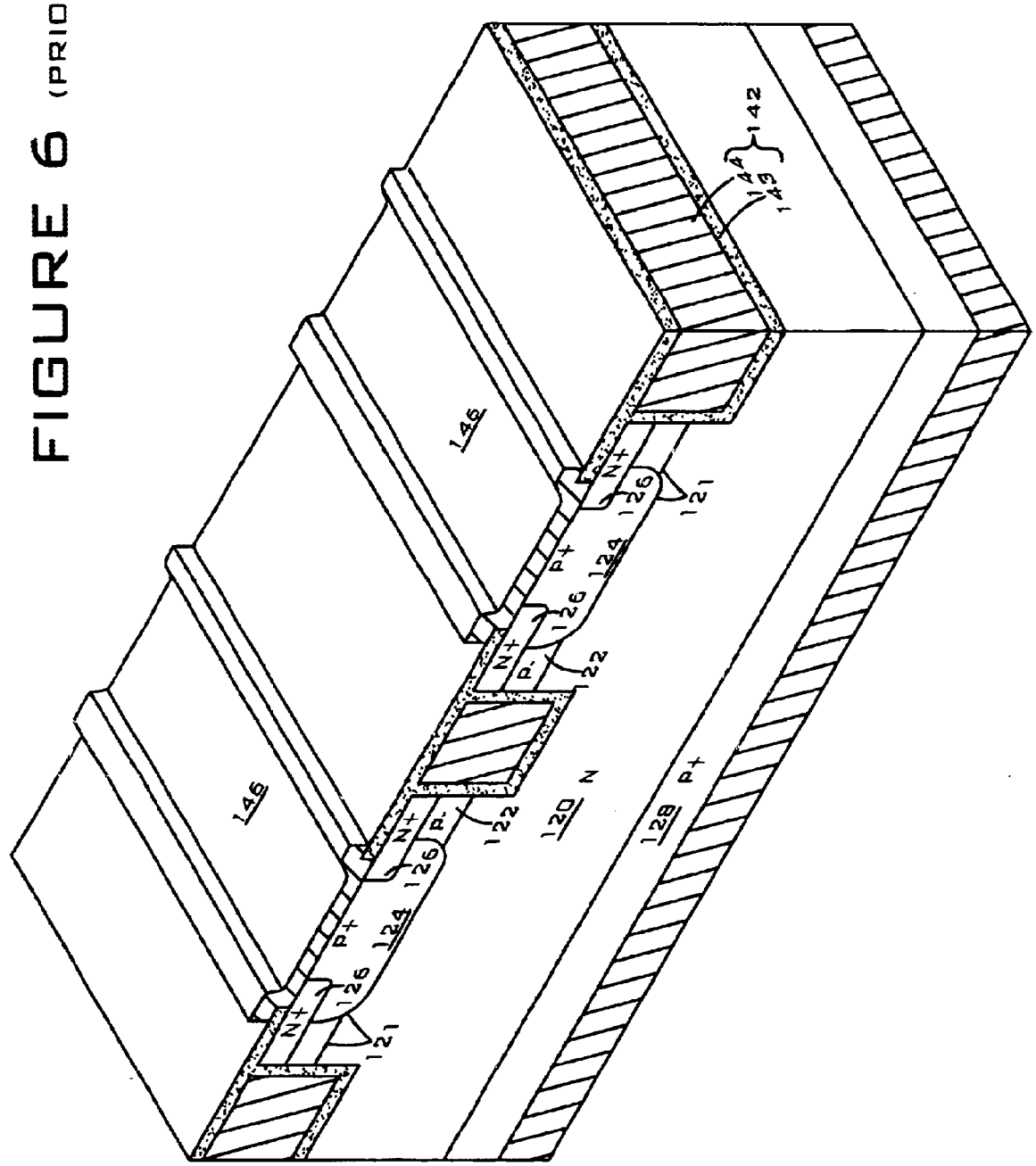
FIG. 6 illustrates a prior art trench gate, vertical IGBT.

A surface gate insulated gate bipolar transistor (IGBT) is illustrated generally at 110S in FIG. 5, while a trench gate prior art IGBT 110T is shown in FIG. 6. The device 110S is structurally similar to or identical to the prior art field effect transistor 10S except for the presence of a heavily doped P type (P+) region 128 adjacent the lower surface of the semiconductor body in place of the N+ drain region. In FIGS. 5 and 6, reference numerals in the 100's are used. In general, reference numerals ending in the same two digits in the figures identify related structure which may not be discussed in full here. The details of the device fabrication process and structure may also be adjusted in order to optimize the operation of the insulated gate bipolar transistor.

In an IGBT, the region 126 is known as the emitter, the region 124 is known as the base, the region 120 is known as the drift region and the region 128 is known as the collector. In the insulated gate bipolar transistor, the same parasitic NPN bipolar transistor is present as is present in the field effect transistor. However, its effect on device operation is substantially different. In particular, increasing the gain of that parasitic NPN bipolar transistor has the effect of reducing the main current level at which the insulated gate bipolar transistor latches in the ON-state. As is well known in the art, one of the objectives in insulated gate bipolar transistors is to prevent them from latching, since when they latch, gate control of the state of the device is lost. Consequently, the adverse effect of the parasitic NPN bipolar transistor in an IGBT is a decrease in the latching current level for the insulated gate bipolar transistor.

Figure 7:
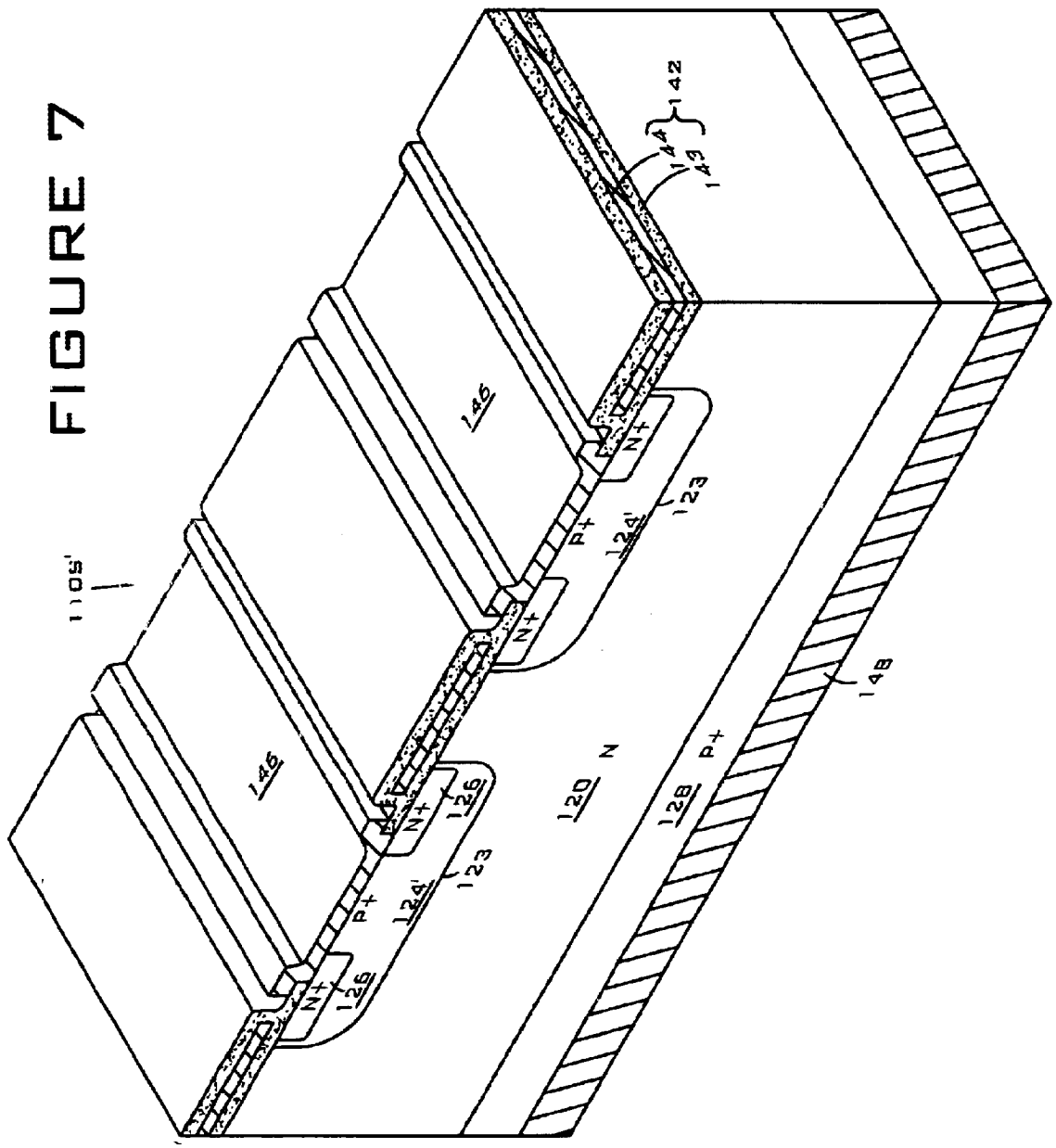
FIG. 7 illustrates a surface gate, vertical IGBT in accordance with the invention.
Figure 8:
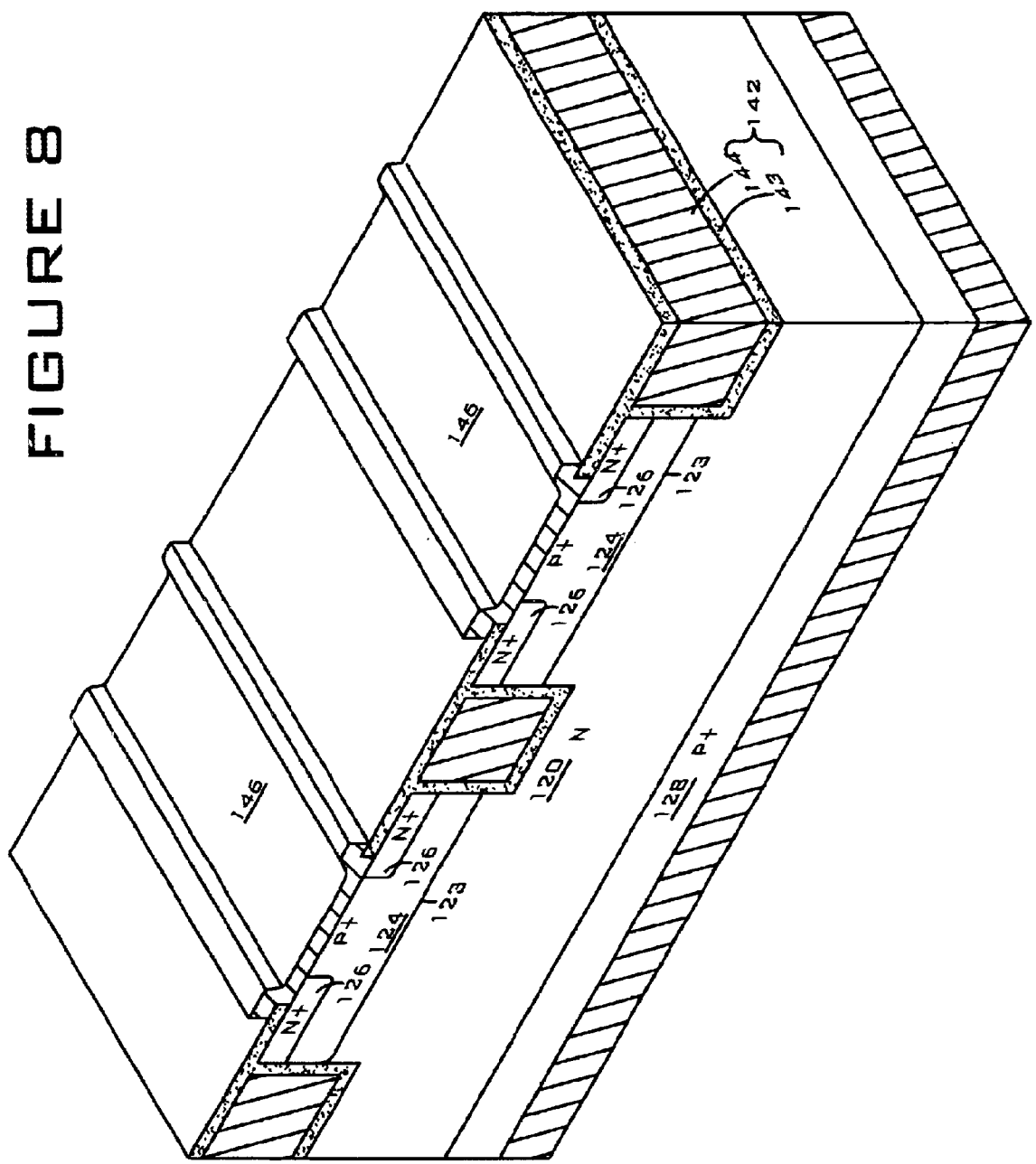
FIG. 8 illustrates a trench gate, vertical IGBT in accordance with the present invention.

Our improved device fabrication method and the structure which results from the use of a combination of boron and one or more of indium, aluminum and gallium to dope the base region has the same beneficial effects in suppressing the gain of the parasitic NPN transistor in the insulated gate bipolar transistor as it does in an FET. A surface gate IGBT 110S' in accordance with the invention is shown in FIG. 7, while a trench gate IGBT 110T' in accordance with the invention is shown in FIG. 8. The devices 110S' and 11T' differ from devices 110S and 110T in a similar manner to that in which FETs 10S' and 10T' differ from FETs 10S and 10T. However, as has been noted, the manner in which this different structure affects the operation of the insulated gate bipolar transistor is substantially different than the manner in which it affects the operation of the field effect transistor, since in the insulated gate bipolar transistor, the purpose of suppressing the gain of the parasitic NPN transistor is to raise the latching current level of the IGBT rather than to maximize the safe operating area as is the case in the field effect transistor.

Figure 9:
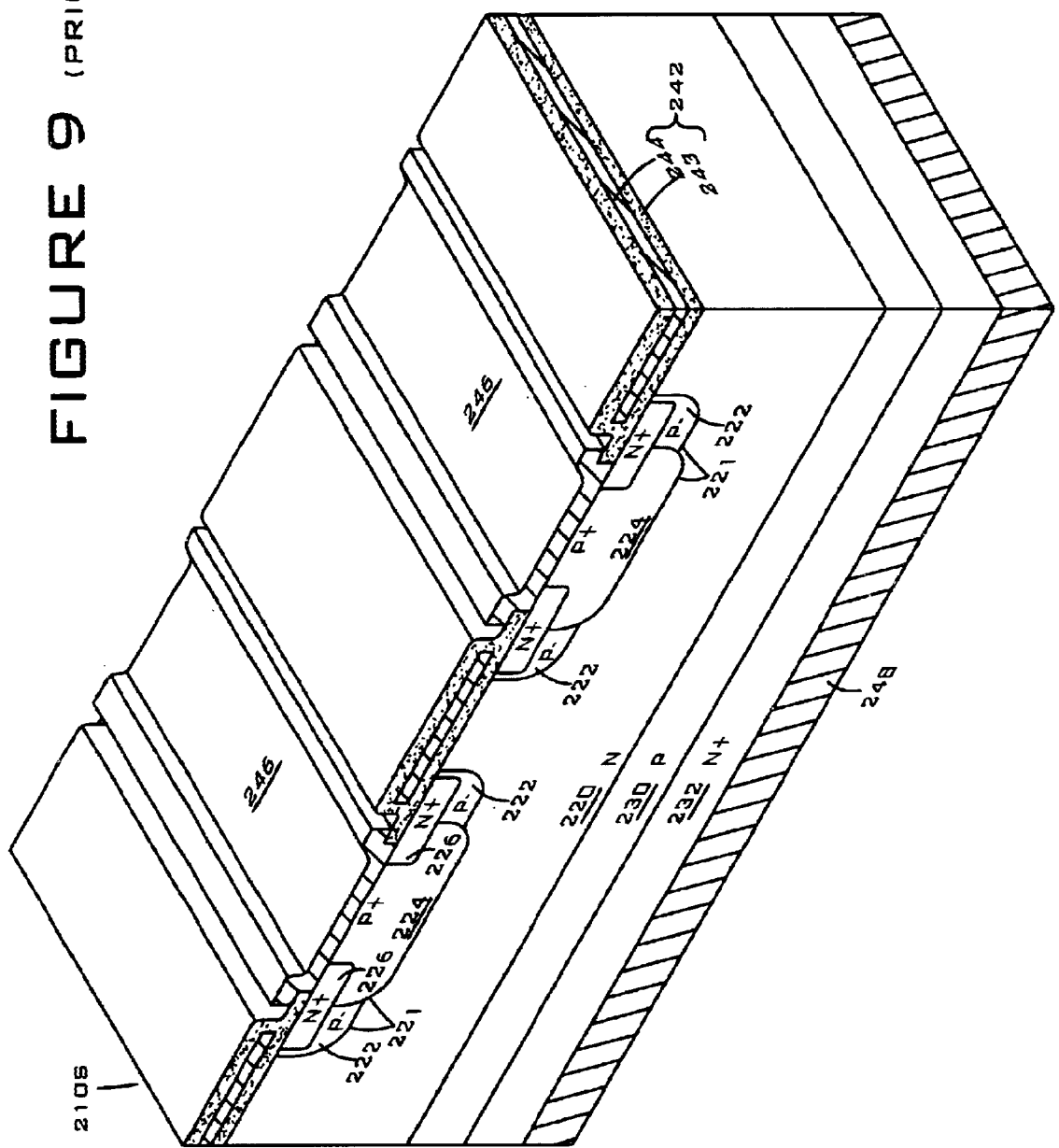
FIG. 9 illustrates a prior art surface gate, vertical MCT structure.
Figure 10:
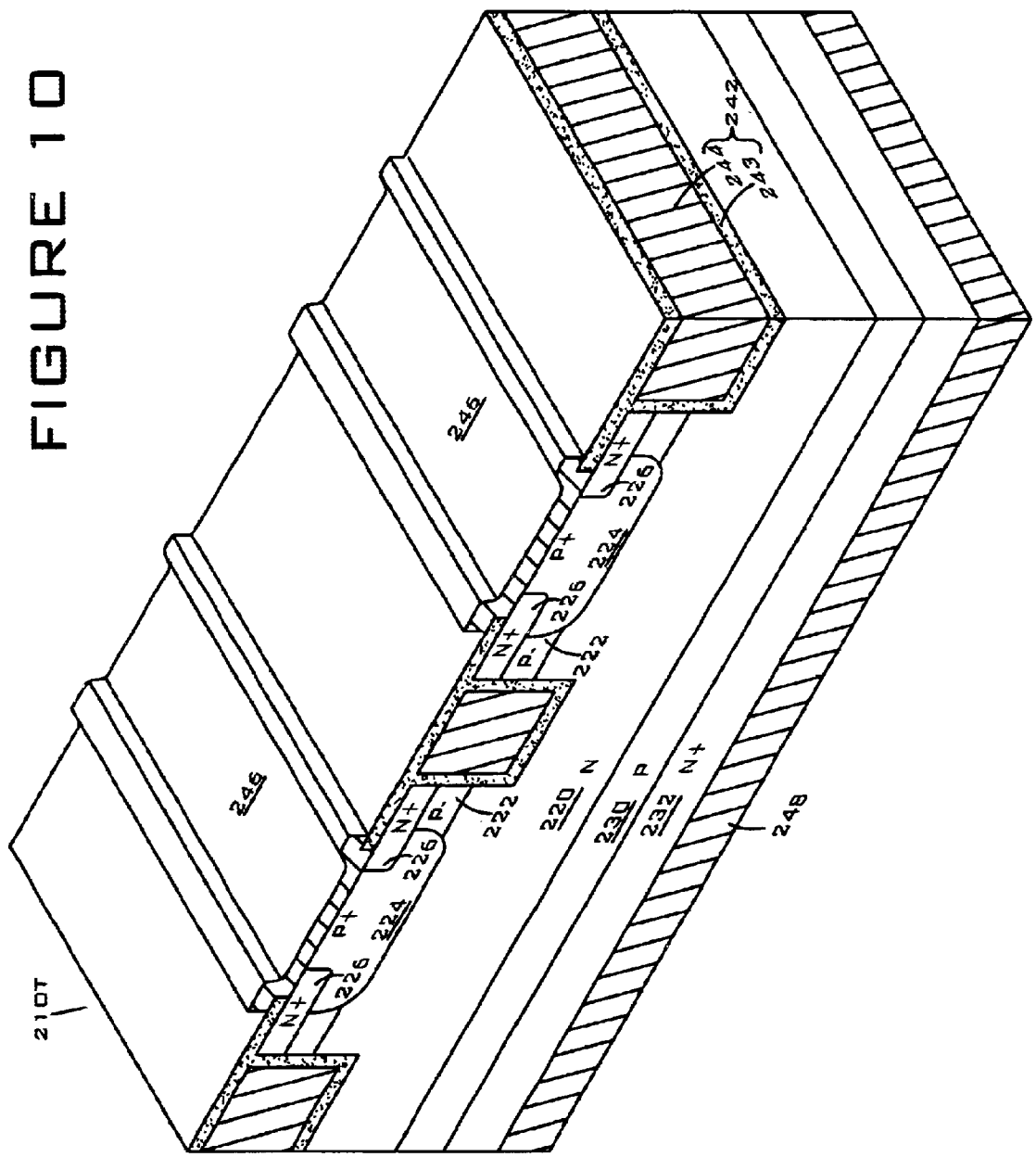
FIG. 10 illustrates a trench gate, vertical MCT structure.
Figure 11:
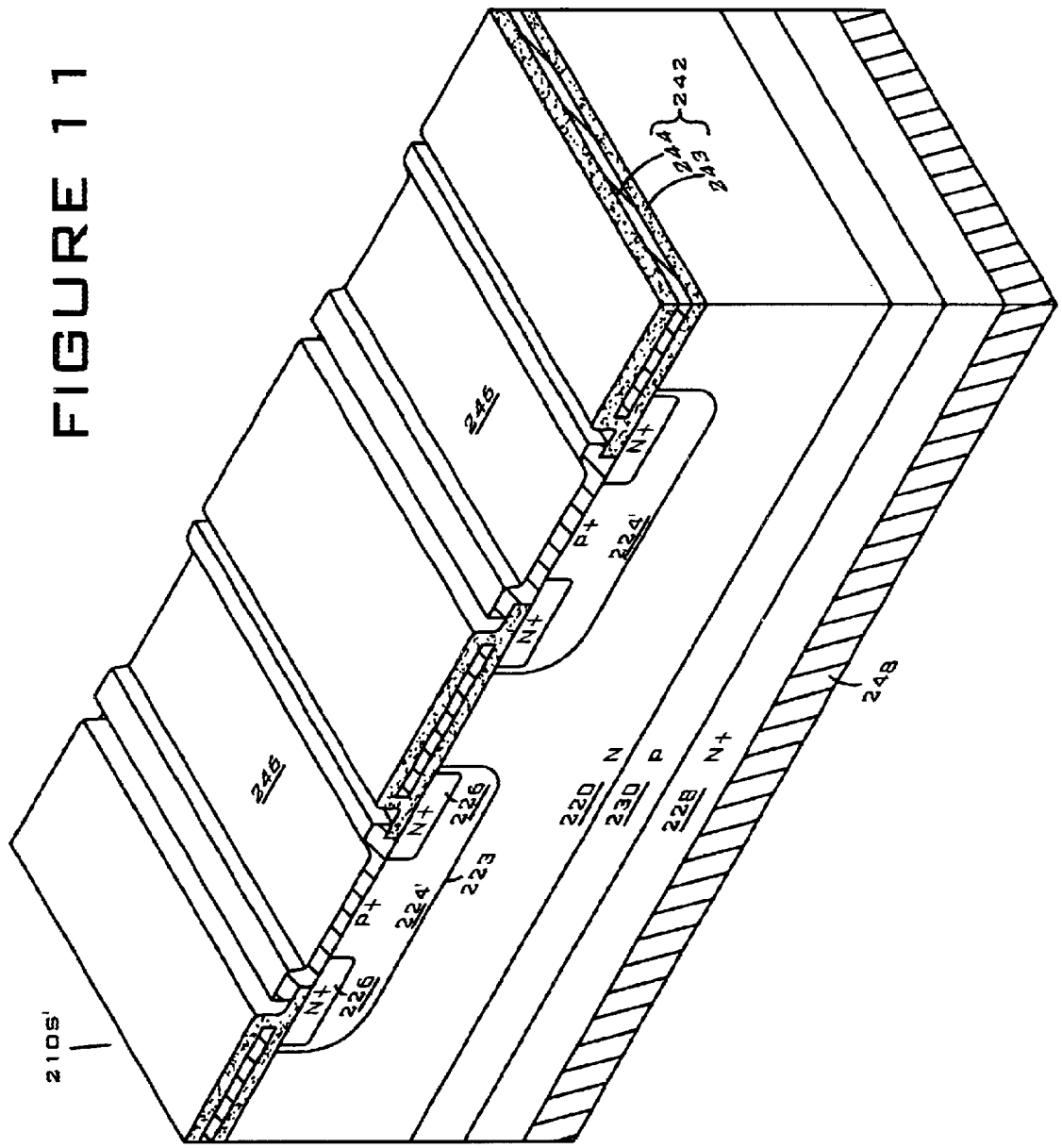
FIG. 11 illustrates a surface gate, vertical MCT in accordance with the present invention.

We have discovered a previously unknown effect of the parasitic NPN bipolar transistor which is introduced into a thyristor when an MOS controlled channel is introduced to control turn-off of the thyristor and thereby provide a MOS Controlled Thyristor (MCT). A prior art surface gate, vertical MCT 210S is shown in FIG. 9, while surface gate and trench gate MCTs in accordance with the present invention are shown at 210S' and 210T' in FIGS. 11 and 12, respectively. FIG. 10 illustrates a trench gate MCT 210T which is made without using our invention.

While the existence of such a parasitic NPN transistor is easily recognized by analogy to the FET and IGBT, neither its effect, nor the magnitude of its effect have been understood or appreciated in the art. Consequently, there has been no suggestion or incentive for doing anything about that parasitic transistor. The known effects of the parasitic NPN bipolar transistor in the MOSFET and the IGBT provide no suggestion that that parasitic transistor will have any adverse effect in the MCT. However, we have found that increasing the gain of the parasitic NPN bipolar transistor indirectly increases the turn-off time for the MCT. This is the result of a series of effects or considerations. First, in order for the MCT to latch the sum of alpha ($\alpha_p$) of the thyristor's PNP (upper) transistor and the alpha ($\alpha_n$) of the thyristor's NPN (lower) transistor must be greater than 1 where a is the current gain of the corresponding inherent transistor of the thyristor. In order to avoid confusion, the inherent PNP and NPN transistors which create the regenerative action of a thyristor are referred to herein as the thyristor's PNP transistor and the thyristor's NPN transistor and the parasitic NPN transistor is referred to by that name to clearly distinguish the parasitic NPN transistor from the inherent or main NPN transistor of the thyristor. The majority of stored charge in an MCT is in the P type (wide) base region. Consequently, the turn-off time of an MCT becomes shorter as the lifetime of carriers in the P type base region decreases because a shorter lifetime results in more rapid recombination of the stored charge in that base region during turn-off of the device. Thus, it is desirable to minimize or "kill" the lifetime in that P type base region. However, the lower the carrier lifetime in the P type base region, the lower the $\alpha_n$ of the thyristor's main NPN transistor becomes. Thus, the requirement that $\alpha_n > 1 - \alpha_p$ places a lower limit on the $\alpha_n$ and a lower limit on carrier lifetime in the P type base region. Thus, if $\alpha_p$ can be increased, $\alpha_n$ and the lifetime in the P type base can both be decreased further. We have recognized that since $\alpha_p$ of the thyristor's PNP transistor is a function of the emitter efficiency of the thyristor's P type emitter region, that efficiency must be maximized. We have also recognized that the parasitic NPN transistor provides an alternate path for the flow of electrons from the N type base region 220 to the main electrode 246 which contacts the P type emitter region 224. As such, the more electrons which flow through the parasitic NPN transistor, the lower the effective emitter efficiency of the P type emitter region becomes. The primary controller of the quantity of electrons which flow through the parasitic NPN transistor is the base transport factor of the parasitic NPN bipolar transistor. The higher the base transport factor, the more electrons flow through that transistor. That base transport factor can be decreased by more heavily doping of the emitter region extension portion 222 of the P type emitter region of the MCT. Consequently, suppressing the gain of the parasitic NPN transistor in the MCT structure allows the turn-off time to be decreased and thus increases the speed of the MCT. This relationship between the speed of the MCT and the characteristics of the parasitic NPN transistor is unrecognized in the prior art, and consequently, the prior art provides no suggestion for providing a heavily doped P type emitter region extension and a counter doped channel in an MCT. We have determined from measurements on actual devices and simulations of them that as much as 50% of electrons may flow through the P type emitter region extension in conventional MCTs, thereby causing a significant adverse effect on the efficiency of the P type emitter. An even larger percentage of the electrons may follow that path during turn-off. That electron flow now appears to be a significant cause of junction avalanche breakdown which we now recognize as a significant cause of the failure of MCTs to turn off at high currents.

Our discovery, for the first time, provides an incentive for heavily doping the emitter region extension and counter doping the channel portion of the P type emitter region extension in an MCT. That is, essentially eliminating the emitter region extension. Use of the combination of boron and one or more of aluminum, indium and gallium as a dopant for the P type emitter region of the MCT provides the benefit of providing a low doped channel portion of a heavily doped P type emitter region in an MCT, independent of whether the channel is located along the planar surface of the semiconductor body or along a sidewall of a trench containing a gate electrode. These improved operating characteristics are also provided in the MCT by use of counter doping to adjust the MOS threshold of a heavily doped emitter region. The benefits of having a heavily doped emitter region with a counter doped or lightly doped channel are equally applicable in complementary MCTs in which the MOS turn-off structure includes a P+ source region disposed in the N type emitter region.

While each of the devices illustrated and described is a vertical device, the invention is also applicable to lateral devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of suppressing activation of a parasitic NPN transistor in FETs, IGBTs and MCTs with a P-type body region having a channel region adjacent a gate oxide layer, the method comprising the steps of:
   doping said P-type body region with boron to a first impurity concentration appropriate for said channel region;
   doping said P-type body region with gallium to a second impurity concentration, the combination of said first impurity concentration and said second impurity concentration being a third impurity concentration that is appropriate for said P-type body region;
   wherein said third impurity concentration decreases about to said first impurity concentration in said channel region by depletion of said gallium into said gate oxide layer.

2. A method of decreasing the turn-off time of an MCT with a P-type body region having a channel region adjacent a gate oxide layer, the method comprising the step of:
   doping said P-type body region with one of the dopants selected from the group of P-type dopants consisting of indium, aluminum and gallium to a first impurity concentration that is appropriate for said P-type body region to thereby suppress activation of a parasitic NPN transistor in the MCT,
   wherein said first impurity concentration decreases to a lower second impurity concentration in said channel region by depletion of said P-type dopants into said gate oxide layer due to the small segregation coefficient of the indium and aluminum and to the higher diffusion rate of the gallium.

3. A method of fabricating a semiconductor device with an N-type source region with a P-type body region therein, the body region having a P-type channel region that contacts an overlying gate oxide layer, the method comprising the steps of:
   (a) forming the P type body region with a P-type dopant comprising a first dopant which either segregates into the gate oxide layer with a segregation coefficient of less than 0.3 or which diffuses through the gate oxide layer at least 2 times faster than it diffuses in a semiconductor material forming the P-type body region;
   (b) growing the gate oxide layer on the surface of the P type body region over and in contact with the channel region, and
   (c) controlling the conductivity of the channel region with the interaction of the first dopant with the gate oxide layer.

4. The method of claim 3 wherein the P-type dopant further comprises boron and wherein the first dopant is one of gallium, indium and aluminum.

* * * * *